United States Patent [19]
Akram et al.

[11] Patent Number: 6,040,239
[45] Date of Patent: Mar. 21, 2000

[54] NON-OXIDIZING TOUCH CONTACT INTERCONNECT FOR SEMICONDUCTOR TEST SYSTEMS AND METHOD OF FABRICATION

[75] Inventors: Salman Akram, Boise; Warren M. Farnworth, Nampa, both of Id.

[73] Assignee: Micron Technology, Inc., Boise, Id.

[21] Appl. No.: 08/916,892

[22] Filed: Aug. 22, 1997

[51] Int. Cl.[7] .................... H01L 21/44; H01L 21/66
[52] U.S. Cl. .................... 438/612; 438/14; 438/18; 438/614
[58] Field of Search ................ 438/618, 14, 15, 438/17, 18, 612, 613, 614

[56] References Cited

U.S. PATENT DOCUMENTS

| | | |
|---|---|---|
| 3,809,625 | 5/1974 | Brown et al. . |
| 4,927,505 | 5/1990 | Sharma et al. . |
| 4,970,571 | 11/1990 | Yamakawa et al. . |
| 5,169,680 | 12/1992 | Ting et al. . |
| 5,302,891 | 4/1994 | Wood et al. . |
| 5,308,796 | 5/1994 | Feldman et al. . |
| 5,326,428 | 7/1994 | Farnworth et al. . |
| 5,419,807 | 5/1995 | Akram et al. . |
| 5,483,741 | 1/1996 | Akram et al. .................... 438/614 |
| 5,495,179 | 2/1996 | Wood et al. . |
| 5,519,332 | 5/1996 | Wood et al. . |
| 5,541,525 | 7/1996 | Wood et al. . |
| 5,578,526 | 11/1996 | Akram et al. . |
| 5,585,282 | 12/1996 | Wood et al. .................... 438/17 |
| 5,607,818 | 3/1997 | Akram et al. . |
| 5,686,317 | 11/1997 | Akram et al. .................... 438/17 |
| 5,716,218 | 2/1998 | Farnworth et al. .................... 438/15 |
| 5,721,496 | 2/1998 | Farnworth et al. . |
| 5,736,456 | 4/1998 | Akram .................... 438/614 |
| 5,786,270 | 7/1998 | Gorrell et al. .................... 438/613 |
| 5,789,271 | 9/1998 | Akram . |
| 5,789,278 | 8/1998 | Akram et al. . |
| 5,801,452 | 9/1998 | Farnworth et al. .................... 257/797 |
| 5,808,360 | 9/1998 | Akram . |
| 5,834,366 | 11/1998 | Akram . |
| 5,834,945 | 11/1998 | Akram et al. . |
| 5,869,787 | 2/1999 | Akram .................... 438/14 |
| 5,869,974 | 2/1999 | Akram et al. . |
| 5,929,647 | 7/1999 | Akram et al. . |
| 5,931,685 | 8/1999 | Hembree et al. . |

*Primary Examiner*—Kevin M. Picardat
*Attorney, Agent, or Firm*—Stephen A. Gratton

[57] ABSTRACT

An interconnect for testing semiconductor components including dice, wafers, and chip scale packages, is provided. The interconnect includes: a substrate; contact members formed on the substrate configured to make temporary electrical connections with the components; and conductors and bonding pads on the substrate for providing electrical paths to the contact members. The contact members, conductors and bonding pads can be covered with an electrolessly deposited barrier layer, and an electrolessly deposited non-oxidizing layer. The non-oxidizing layer on the contact members forms a touch contact surface for forming low resistance electrical connections with the contacts on the components. Preferred materials for the non-oxidizing layer include palladium, gold, tungsten and platinum. Also provided are a method for fabricating the interconnect, and test systems employing the interconnect.

47 Claims, 5 Drawing Sheets

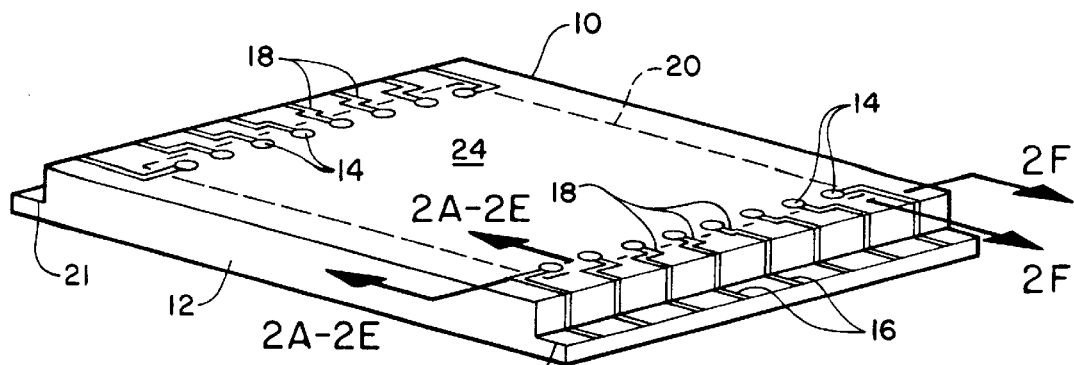
FIGURE 1
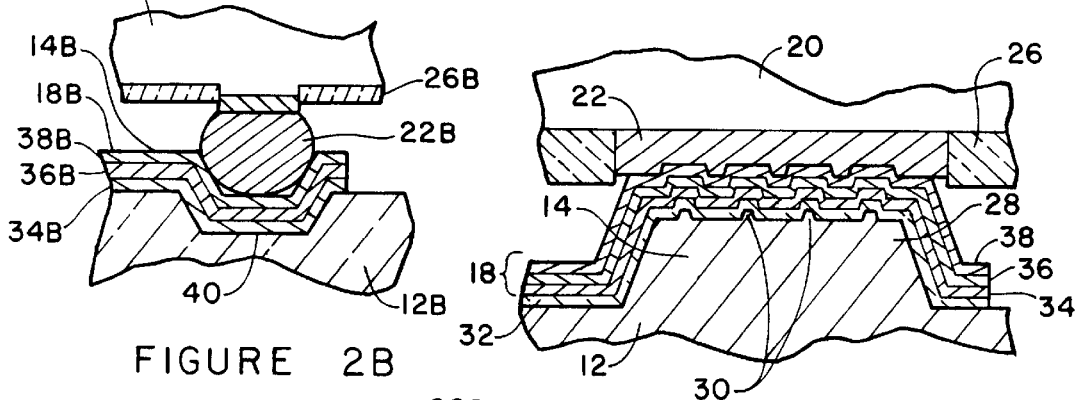
FIGURE 2B
FIGURE 2A
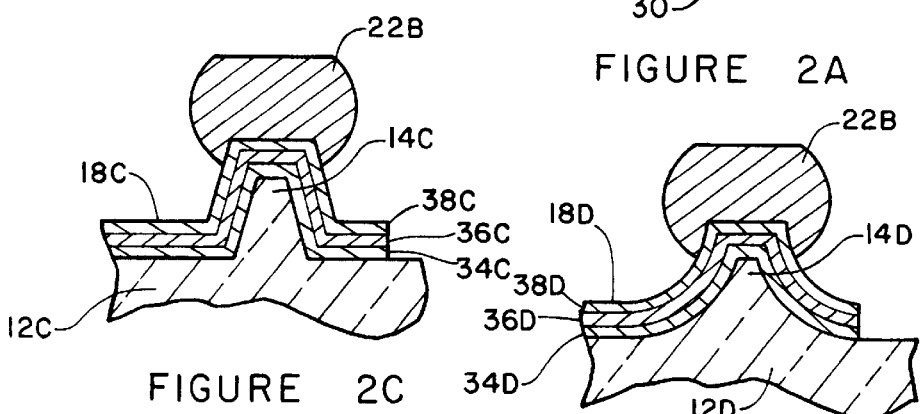
FIGURE 2C
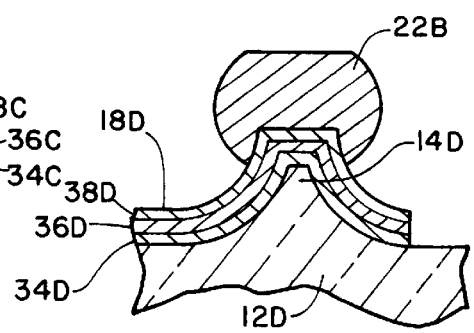
FIGURE 2D
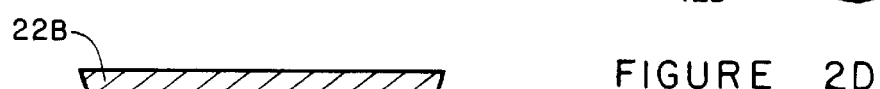
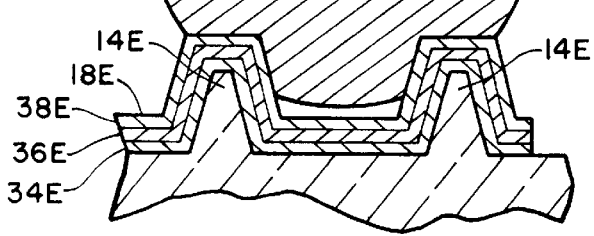
FIGURE 2E
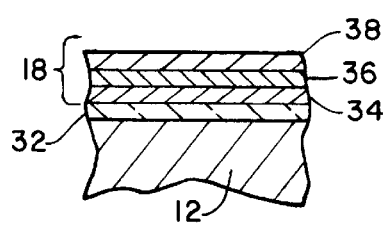
FIGURE 2F

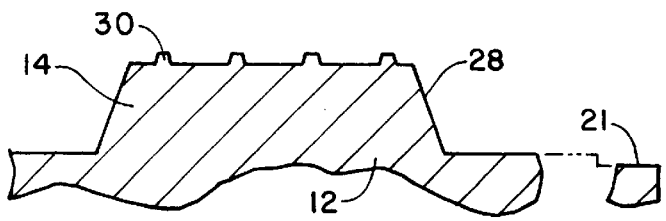
FIGURE 4A
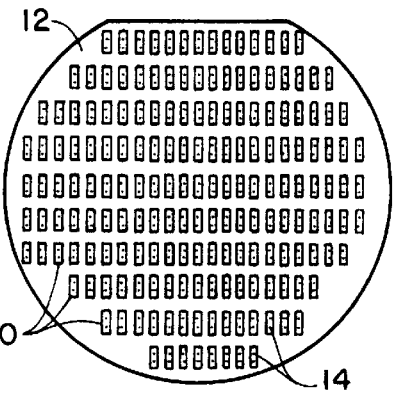
FIGURE 5A
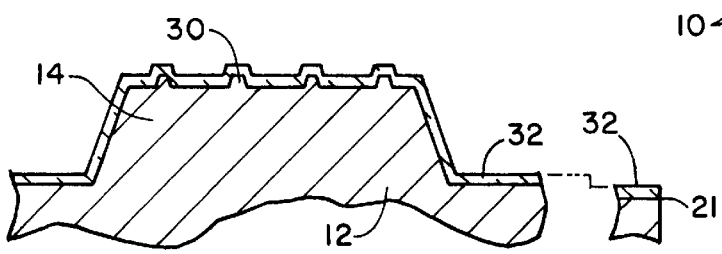
FIGURE 4B
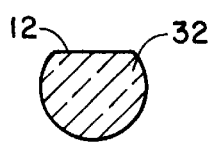
FIGURE 5B
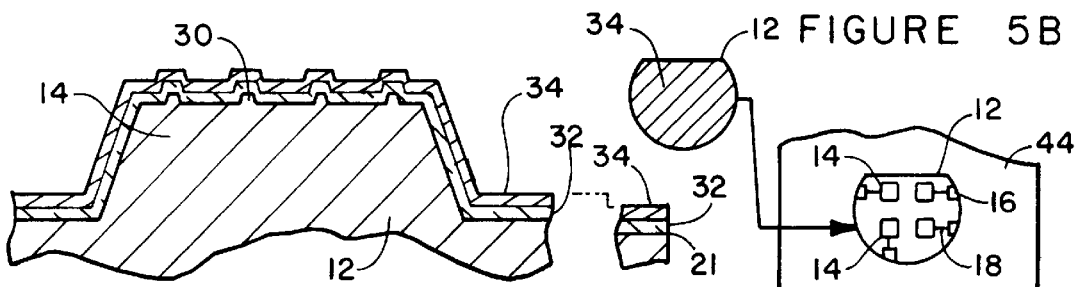
FIGURE 4C
FIGURE 5C
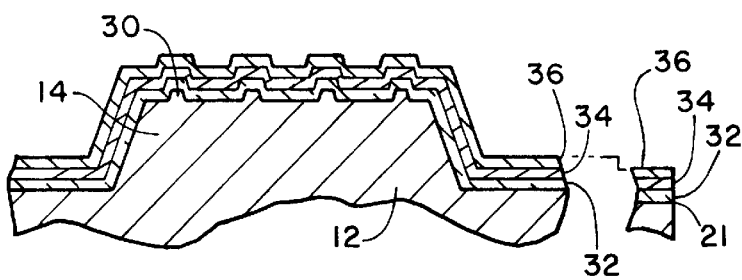
FIGURE 4D
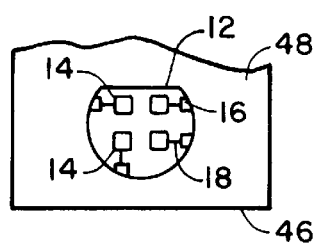
FIGURE 5D
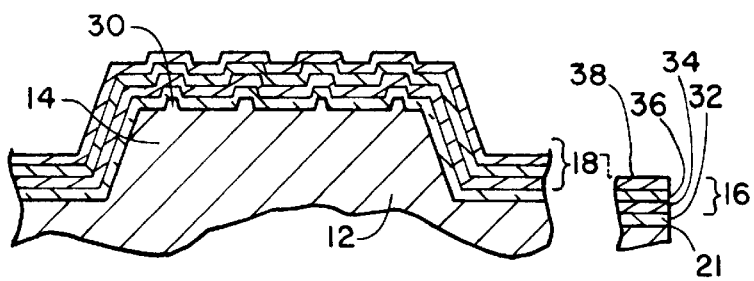
FIGURE 4E
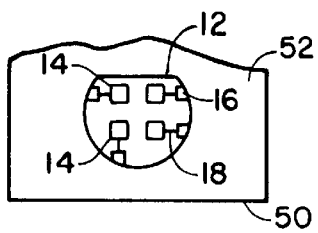
FIGURE 5E

NON-OXIDIZING TOUCH CONTACT INTERCONNECT FOR SEMICONDUCTOR TEST SYSTEMS AND METHOD OF FABRICATION

FIELD OF THE INVENTION

This invention relates to interconnects for testing semiconductor components, such as semiconductor wafers, singulated dice and chip scale packages. In addition, this invention relates to a method for fabricating interconnects and to test systems employing interconnects.

BACKGROUND OF THE INVENTION

Semiconductor components, such as wafers, singulated dice, and chip scale packages must be tested and burned-in prior to use in multi chip modules and other electronic devices. For performing these test procedures, temporary electrical connections can be made to contacts on the components. Test signals can then be transmitted through the temporary electrical connections to the integrated circuits contained on the components. For wafers and singulated dice, the contacts typically comprise aluminum bond pads, or alternately solder bumps. For chip scale packages the contacts typically comprise solder bumps.

The temporary electrical connections can be made to the contacts on the components using an interconnect. The interconnect includes contact members configured to electrically engage the contacts on the components. U.S. Pat. No. 5,483,741 to Akram et al. describes an exemplary interconnect for singulated dice. The '741 interconnect includes a silicon substrate with raised contact members covered with a metal silicide layer.

One aspect of these interconnects is that the contact members must be capable of forming low resistance, or "ohmic", electrical connections with the contacts on the components. Typically, the contacts on the components include a native oxide layer (e.g., aluminum oxide) that must be penetrated to electrically contact the underlying metal.

However, the contact members on the interconnect can also include native oxide layers that can affect the electrical characteristics of the temporary electrical connections with the components being tested. For example, metal silicide contact members are subject to oxidation, which increases the electrical resistivity of the temporary electrical connections with the components. The electrical resistivity of the temporary electrical connections is also a function of the resistivity of the materials which form the contact members. It would be desirable to be able to form the contact members on interconnects with non-oxidizing, low-resistivity materials.

Another aspect of interconnects used for testing semiconductor components is that electrical paths must be made between the contact members on the interconnects, and external test circuitry. These electrical paths sometimes include wire bonds. If the contact members are formed of a material, such as a metal silicide, that cannot be easily wire bonded, then additional layers must be added to the interconnect to provide wire bonding sites. It would be desirable to be able to form the contact members on interconnects with wire-bondable materials.

In view of the foregoing, the present invention is directed to an improved interconnect having contact members covered with a non-oxidizing, wire bondable layer.

SUMMARY OF THE INVENTION

In accordance with the present invention, an improved interconnect for testing semiconductor components, a method for fabricating the interconnect, and test systems employing the interconnect, are provided. The interconnect includes a substrate with patterns of contact members for contacting the component. The contact members can be configured for contacting planar contacts on the components (e.g., bondpads, test pads), or alternately, can be configured for contacting contact bumps on the components (e.g., solder bumps). In addition to the contact members, the interconnect includes patterns of conductors formed on the substrate in electrical communication with the contact members. The conductors can include bonding pads for forming bonded electrical connections, such as wire bonds, or solder bonds, between the interconnect and a test apparatus adapted to apply test signals to the components.

The interconnect also includes an electrolessly deposited non-oxidizing layer covering the contact members, conductors and bonding pads. Preferred materials for the non-oxidizing layer include palladium, gold, tungsten, platinum, gold-platinum, silver-palladium, silver-platinum, palladium-gold and nickel-cobalt. On the contact members, the non-oxidizing layer forms a low resistivity "touch" surface for electrically contacting the contacts on the components. On the bonding pads, the non-oxidizing layer is wire bondable and solderable, which permits bonded connections to be made to the bonding pads.

The method for fabricating the interconnect, simply stated, includes the steps of: providing the substrate; forming the contact members on the substrate; depositing and patterning a conductive layer on the contact members and substrate to form conductors and bonding pads for the contact members; and then electrolessly depositing a barrier layer, and a non-oxidizing layer on the patterned conductive layer.

Different embodiments of contact members are provided for electrically contacting different types of contacts on the components. For contacting planar contacts, such as aluminum bond pads, the contact members can comprise raised pillars and penetrating projections covered with the conductive layer. For contacting contact bumps, such as solder bumps, the contact members can comprise indentations covered with the conductive layer. The indentations can include a stepped edge for penetrating the contact bumps and can be shaped to prevent excessive deformation of the contact bumps.

In the illustrative embodiments the conductive layer can be a highly conductive metal, such as copper or aluminum, formed using a suitable metallization process (e.g., deposition, patterning, etching). Following formation thereof, the conductive layer can be cleaned and activated in a zincate solution. Next, the barrier layer can be electrolessly deposited on the conductive layer. Preferred materials for the barrier layer include nickel, zinc, chromium, and palladium. Following electroless deposition of the barrier layer, the non-oxidizing layer can be electrolessly deposited on the barrier layer. During formation of the barrier and non-oxidizing layers, masks are not required, as plating to the exposed conductive layer is automatic.

The completed interconnect can be used in a die level test system for testing singulated dice and chip scale packages, or in a wafer level system for testing dice contained on a semiconductor wafer. In the die level system, the interconnect can be mounted to a test carrier configured to contain the dice or chip scale packages. In the wafer level system, the interconnect can be wafer-sized and configured for mounting to a wafer handler in place of a conventional probe card.

BRIEF DESCRIPTION OF THE DRAWINGS

FIG. 1 is a schematic perspective view of an interconnect constructed in accordance with the invention;

FIGS. 2A–2E are enlarged schematic cross sectional views taken along section line 2A–E–2A—E of FIG. 1, illustrating different embodiment contact members of the interconnect, in electrical contact with contacts on a semiconductor component;

FIG. 2F is an enlarged schematic cross sectional view taken along section line 2F—2F of FIG. 1 showing a conductor of the interconnect;

FIGS. 4A–E are enlarged schematic cross sectional views illustrating the contact member of FIG. 2A during fabrication;

FIGS. 5A–5E are schematic views corresponding to FIGS. 4A–4E illustrating process steps in the method of fabrication;

DETAILED DESCRIPTION OF THE PREFERRED EMBODIMENTS

Figure 3:
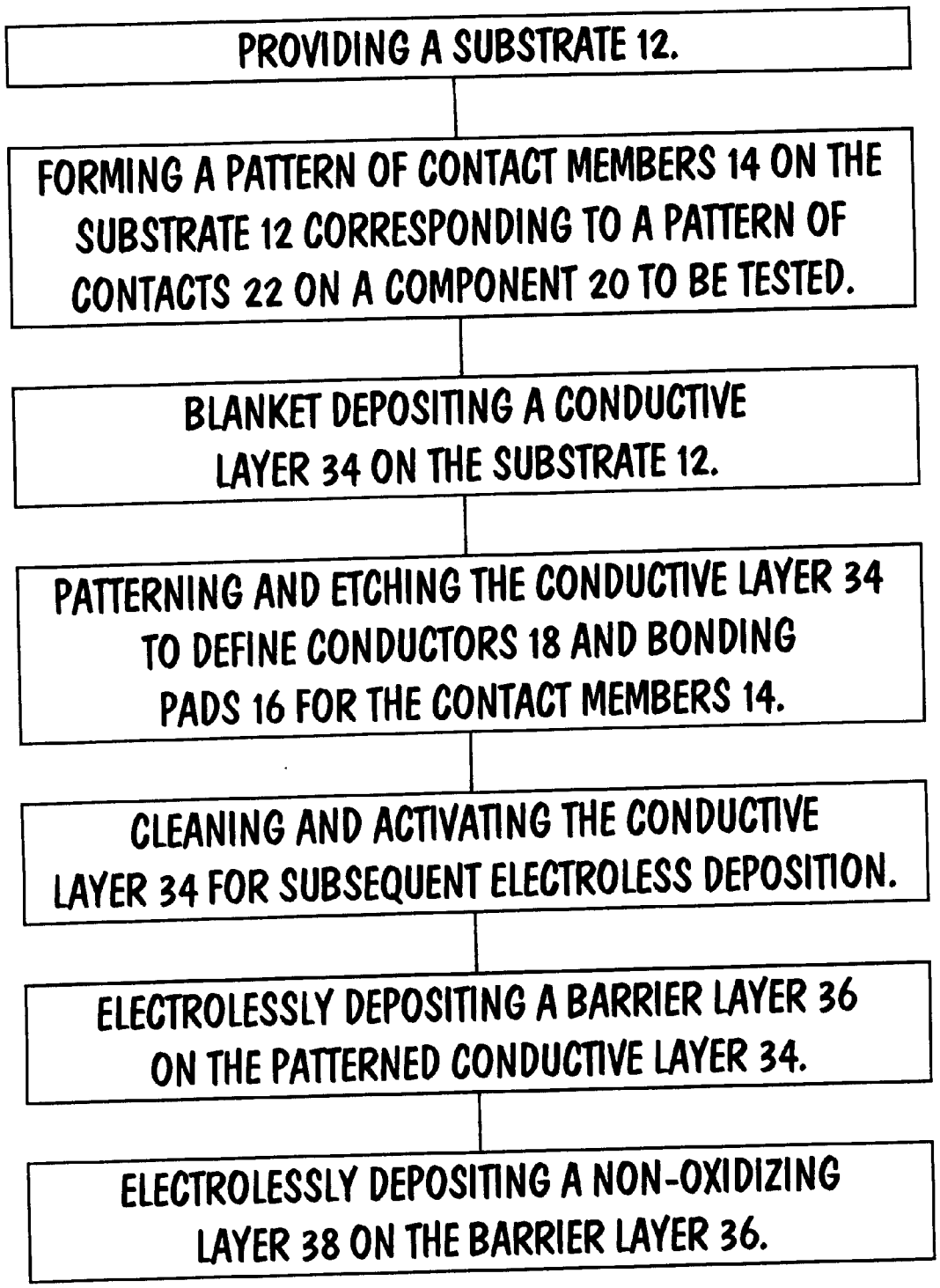
FIG. 3 is a block diagram illustrating broad steps in the method of the invention.

Referring to FIG. 1, an interconnect 10 constructed in accordance with the invention is shown. The interconnect 10 is configured to establish temporary electrical communication with a semiconductor component 20 for testing. The interconnect 10 generally stated, comprises: a substrate 12; patterns of contact members 14 formed on the substrate 12; patterns of conductors 18 formed on the substrate 12 in electrical communication with the contact members 14; and patterns of bond pads 16 formed along opposite stepped edges 21 of the substrate 12.

The substrate 12 can be formed of a rigid material having a CTE that matches, or is close to, the CTE of silicon. Preferred materials for the substrate 12 include silicon, ceramic, and photo-machineable glass. The substrate 12 includes a face 24 wherein the contact members 14 and conductors 18 are formed using processes to be hereinafter described. In addition, the substrate 12 includes stepped edges 21 on opposite sides thereof, wherein the bond pads 16 and portions of the conductors 18 can be formed. The stepped edges 21 can be formed by etching or machining the substrate 12. As will be further explained, the stepped edges 21 provide clearance for bonded connections (i.e., wire bonds, solder bonds) to the bond pads 16. The substrate 12 can also include an insulating layer 32 (FIG. 2A) for electrically insulating the bulk of the substrate 12 from the contact members 14 and conductors 18.

Referring to FIG. 2A, an individual contact member 14 is illustrated in an enlarged cross sectional view. FIGS. 2B–2E illustrate alternate embodiment contact members 14B–14E.

In FIG. 2A, the contact member 14 is configured to make a temporary electrical connection with a planar contact 22 on the component 20. By way of example, the planar contact 22 can comprise an aluminum bond pad having a thickness of from about 1.0 μm to 1.5 μm. The contact 22 can be embedded in a passivation layer 26 of the component 20.

The contact member 14 comprises a raised pillar 28 with penetrating projections 30 adapted to penetrate the contact 22 on the component 20 to a limited penetration depth. The pillar 28 and projections 30 can be formed integrally with the substrate 12 using an etching process to be hereinafter described. The contact member 14 is covered by a tri-metal stack including a conductive layer 34, a barrier layer 36, and a non-oxidizing layer 38.

As shown in FIG. 2F, the bonding pads 16 and the conductors 18 can be formed by the same tri-metal stack including the conductive layer 34, the barrier layer 36 and the non-oxidizing layer 38. Processes for forming the conductive layer 34, barrier layer 36 and non-oxidizing layer 38 will be hereinafter described.

Referring to FIG. 2B, an alternate embodiment contact member 14B is illustrated. Contact member 14B is adapted to make a temporary electrical connection with a contact bump 22B of a bumped semiconductor component 20B. By way of example, the contact bump 22B can comprise a solder bump having a diameter of from 3 mils to 30 mils. Representative solder alloys for the contact bump 22B include 95%Pb 5%Sn, 60% Pb/40%Sn, 63%In/37%Sn, 100%Sn, or 62%Pb/36%Sn/2%Ag.

In the embodiment of FIG. 2B, a substrate 12B for the contact member 14B comprises an electrically insulating ceramic. Accordingly, an insulating layer is not required. However, were the substrate 12B to be formed of silicon, an insulating layer (not shown) would be required. The contact member 12B includes an indentation 40 in the substrate 12B sized to retain the contact bump 22B. The indentation 40 is covered by a tri-metal stack including a conductive layer 34B, a barrier layer 36B, and a non-oxidizing layer 38B. As before, conductors 18B can comprise the same conductive layer 34B, barrier layer 36B, and non-oxidizing layer 38B.

Referring to FIG. 2C, an alternate embodiment contact member 14C comprises a pillar formed integrally with a substrate 12C using an anisotropic etch process. With the substrate 12C formed of ceramic, an insulating layer is not required. The contact member 14C is adapted to penetrate and make a temporary electrical connection with the contact bump 22B. The contact member 14C is covered by a tri-metal stack including a conductive layer 34B, a barrier layer 36C, and a non-oxidizing layer 38C. Conductors 14C can comprise the same layers.

Referring to FIG. 2D, an alternate embodiment contact member 14D comprises a pillar formed integrally with a substrate 12D using an isotropic etch process. Depending on the substrate 12D material, an insulating layer (not shown) can also be formed. The contact member 14D is adapted to penetrate and make a temporary electrical connection with the contact bump 22B. The contact member 14D is covered by a tri-metal stack including a conductive layer 34D, a barrier layer 36D, and a non-oxidizing layer 38D. Conductors 14D can comprise the same layers.

Referring to FIG. 2E, an alternate embodiment contact member 14E comprises an array of two or more pillars formed integrally with a substrate 12E using an anisotropic etch process. The contact member 14E is adapted to retain and make a temporary electrical connection with the contact bump 22B substantially as shown. The contact member 14E is covered by a tri-metal stack including a conductive layer 34E, a barrier layer 36E, and a non-oxidizing layer 38E. Conductors 18E can comprise the same layers.

Referring to FIG. 3, broad steps in a method for fabricating the interconnect 10 are illustrated. These steps include:

Providing a substrate 12.

Forming a pattern of contact members 14 on the substrate 12 corresponding to a pattern of contacts 22 on a component 20 to be tested.

Blanket depositing a conductive layer 34 on the substrate 12.

Patterning and etching the conductive layer 34 to define conductors 18 and bonding pads 16 for the contact members 14.

Cleaning and activating the conductive layer 34 for subsequent electroless deposition.

Electrolessly depositing a barrier layer 36 on the patterned conductive layer 34.

Electrolessly depositing a non-oxidizing layer 38 on the barrier layer 36.

Referring to FIGS. 4A–4E and 5A–5E, the above steps are schematically illustrated. Initially, as shown in FIG. 5A, the substrate 12 can be provided. In the illustrative embodiment the substrate 12 comprises a silicon wafer on which multiple interconnects 10 and contact members 14 will be fabricated. Following the fabrication process, the wafer can be singulated into individual interconnects 10. Rather than being silicon, the substrate 12 can also be formed of ceramic, photomachineable glass, or germanium.

Referring to FIG. 4A, the penetrating projections 30 can be formed by forming a mask (not shown) on the substrate 12 and then etching the substrate 12 through the mask. For example, a hard mask can be formed on the substrate 12 by depositing a layer of silicon nitride ($Si_3N_4$) and then patterning the silicon nitride layer using hot phosphoric acid. A wet or dry, isotropic or anisotropic, etch process can then be used to etch through openings in the hard mask to form the penetrating projections 30. By way of example, an anisotropic etch can be performed on a substrate 12 formed of silicon using a solution of KOH and $H_2O$.

The penetrating projections 30 can be elongated blades or sharp points formed in locations that match the placement of the contacts 22 (FIG. 2A) on the component 20. In the illustrative embodiment, there are four projections 30 per contact member 14. However, a greater or lesser number of penetrating projections 30 can be formed. In addition, the projections 30 for each contact member 14 can be formed in a pattern having an outline contained within the perimeter of the contacts 22 (FIG. 2A) on the component 20. A representative height for the projections 30 measured from the base to the tip can be from 0.2 to 1 $\mu$m. A representative length for the projections 30 measured from end to end of the projections 30 can be from 3 to 10 $\mu$m.

Once the projections 30 are formed, the hard mask can be stripped and another mask (not shown) can be formed for etching the substrate 12 to form the contact members 14. Using an anisotropic etch process, the contact members 14 can be formed as topographically elevated pillars generally conical in cross section. A representative height of the contact members 14 from base to tip can be from 50–100 $\mu$m. A representative width of each side of the contact members 14 can be from 40–80 $\mu$m. Following formation of the contact members 14, the etch mask can be stripped.

Suitable etch processes for forming the contact members 14 and projections 30 substantially as shown in FIG. 4A, are also disclosed in U.S. Pat. Nos. 5,326,428; 5,419,807 and 5,483,741 which are incorporated herein by reference.

Still referring to FIG. 4A, the stepped edge 21 can also be formed on opposite edges of the substrate 12 using a mask (not shown) and an anisotropic wet etch as previously described. The bonding pads 16 (FIG. 1) for the conductors 18 will subsequently be formed on the stepped edge 21.

Referring to FIGS. 4B and 5B, once the projections 30 and contact members 14 are formed, the insulating layer 32 can be formed over the entire substrate 12. The insulating layer 32 can be a grown or deposited material, such as $SiO_2$ or $Si_3N_4$. A representative thickness for the insulating layer 32 can be from 500 Å to 1 $\mu$m. The insulating layer 32 can also be a deposited polymer, such as polyimide.

Next, as shown in FIG. 4C, the conductive layer 34 can be formed on the insulating layer 32. To form the conductive layer 34, a highly conductive metal can be blanket deposited on the substrate 12 by sputtering or other deposition process. Exemplary metals include copper and aluminum, and alloys of these metals. A representative thickness for the conductive layer 34 can be from 500 Å to 2 $\mu$m.

Following blanket deposition of the conductive layer 34, a resist mask (not shown) can be formed for etching the conductive layer 34 such that the contact members 14 remain covered with the conductive layer 34, and the conductors 18 and bonding pads 16 are defined. The resist mask can be formed by depositing a layer of resist, followed by hardening, exposure and development. Following formation of the resist mask a suitable wet etchant can be used to etch the conductive layer 34. U.S. Pat. No. 5,607,818, incorporated herein by reference, describes a method for patterning a conductive layer using an electrophoretically deposited layer of resist and wet etching.

As an alternative to a metallization process (i.e., deposition, mask formation, etching), the conductive layer 34 can be formed as a metal silicide using a process as disclosed in U.S. Pat. No. 5,483,741, incorporated herein by reference.

As shown in FIG. 5C, following deposition and patterning of the conductive layer 34, a cleaning and activating step can be performed. The cleaning and activating can be performed by submerging the substrate 12 in an activation bath 42. The activation bath 42 contains an activation solution 44 at a temperature of from 20° C. to 40° C. In general, the activation solution 44 functions to strip native oxide layers on the conductive layer 34. One suitable activation solution includes a zincate, such as $ZnO_2$ or $Zn(OH_4)$. Zincate solutions are commercially available from Lea Ronal, as well as other manufacturers.

Next, as shown in FIGS. 4D and 5D, the barrier layer 36 can be formed on the conductive layer 34. In general, the barrier layer 36 prevents diffusion of the conductive layer 34 and provides adhesion for the subsequently deposited non-oxidizing layer 38. Preferred materials for the barrier layer 34 include nickel, zinc, chromium and palladium. A barrier metal bath 46 containing a barrier metal solution 48 can be used to electrolessly deposit the barrier layer 36 onto the patterned conductive layer 34. For depositing a nickel barrier layer 36, a suitable barrier metal solution 48 can include nickel chloride, sodium hydroxyacetate, and sodium hypophosphate at a temperature of about 85° to 90° C. Such a solution is commercially available from Lea Ronal under the trademark "PALLAMERSE Ni".

Electroless deposition of the barrier layer 36 is self aligning in that the barrier metal automatically deposits on the conductive layer 34. A representative thickness for the barrier layer 36 can be from 500 Å to 10 $\mu$m. This thickness can be achieved by controlling the concentration of the barrier metal solution 48 and the time period during which the substrate 12 is submerged. A representative time period for a 6 gm/liter solution containing a barrier metal compound can be from one to five minutes.

Next, as shown in FIGS. 4E and 5E, the non-oxidizing layer 38 can be deposited on the barrier layer 36. Preferred metals for the non-oxidizing layer 38 include palladium, gold, tungsten and platinum. Alloys of these metals such as gold-platinum, silver-palladium, silver-platinum, palladium-gold and nickel-cobalt can also be utilized to form the non-oxidizing layer 38.

A non-oxidizing metal bath 50 containing a non-oxidizing metal solution 52 can be used to electrolessly deposit the non-oxidizing layer 38 onto the barrier layer 36. For depositing a palladium non-oxidizing layer 38, a suitable solution 52 can include palladium chloride and sodium hypophosphate at a temperature of about 50° to 60° C. Such a solution is commercially available from Lea Ronal under the trademark "PALLAMERSE Pd".

As with electroless deposition of the barrier layer 36, electroless deposition of the non-oxidizing layer 38 is self aligning in that the metal will automatically deposit on the barrier layer 36. A representative thickness for the non-oxidizing layer 38 can be from 500 Å to 10 μm or greater. This thickness can be selected to compensate for wear during continued use of the interconnect 10.

The thickness of the non-oxidizing layer 38 can be achieved by controlling the concentration of the solution 52 and the time period for which the substrate 12 is submerged. A representative time period for a 1 gm/liter solution can be from one to two minutes.

Following the electroless deposition processes, the substrate 12 can be singulated to form the individual interconnects 10. Singulation can be by saw cutting or shearing. In the case of a wafer level interconnect 10W (FIG. 9B), singulation may not be required. As shown in FIG. 4E, the completed interconnect 10 includes the contact members 14 covered with a tri-metal stack comprising the conductive layer 34, the barrier layer 36 and the non-oxidizing layer 38. The conductors 18 and bonding pads 16 are formed by the same tri-metal stack. In addition, the insulating layer 32 electrically insulates the contact members 14, conductors 18 and bonding pads 16 from the bulk of the substrate 12.

Figure 6A:
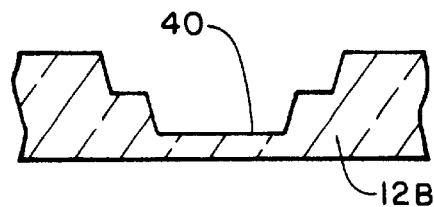
FIGS. 6A–6D are schematic cross sectional views illustrating the contact member of FIG. 2B during fabrication.

Referring to FIGS. 6A–6D, steps in the formation of the alternate embodiment contact member 14B are illustrated. Initially, the substrate 12B can be provided. In this embodiment the substrate 12B comprises ceramic so that an insulating layer is not required. As shown in FIG. 6A, the indentation 40 can be formed in the substrate 12B by etching, machining or laser ablation. A size of the indentation 40 will be dependent on the diameter of the contact bump 22B (FIG. 2B). In general, the indentation 40 can be slightly smaller than the contact bump 22B to retain the contact bump 22B or portion thereof. In addition, the indentation 40 can include sloped walls to prevent sticking of the contact bumps 22B and to self-align the contact bumps 22B to the contact member 14B.

Figure 6B:
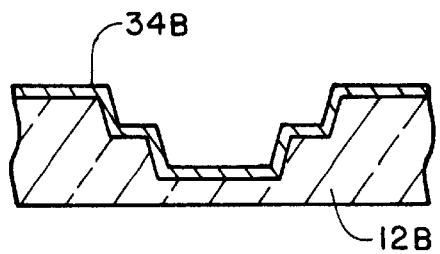
Figure 6C:
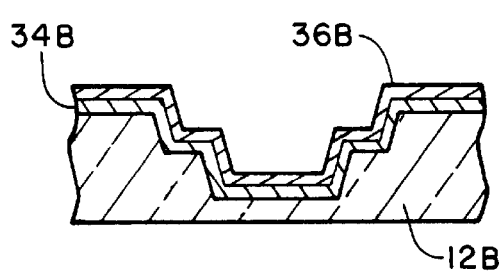
Figure 6D:
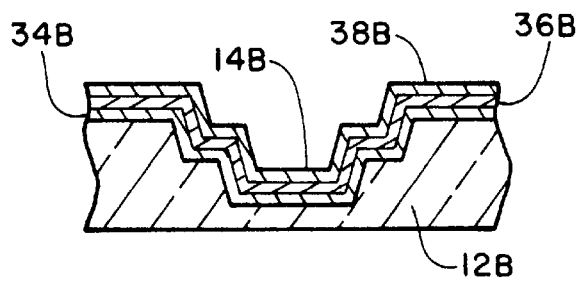

Next, as shown in FIG. 6B, the conductive layer 34B can be formed in the indentation using a metallization process as previously described. Next, as shown in FIG. 6C, the barrier layer 36B can be formed on the conductive layer 34B using electroless deposition as previously described. Next, as shown in FIG. 6D, the non-oxidizing layer 38B can be formed on the barrier layer 36B using electroless deposition as previously described.

Figure 7A:
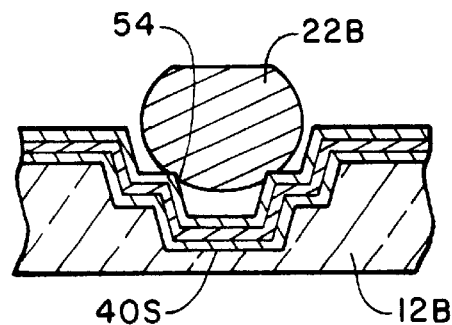
FIGS. 7A–7B are schematic cross sectional views illustrating operational characteristics of an alternate embodiment contact member.
Figure 7B:
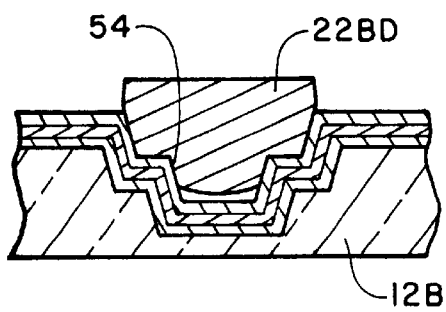

Referring to FIGS. 7A and 7B, an indentation 40S can have a stepped-pyramidal, or inverted "ziggurat" shape, comprising an upper cavity with sloped walls, and a smaller lower cavity with sloped walls. As shown in FIG. 7A, edges 54 are formed by the stepped indentation. The edges 54 are adapted to penetrate oxide layers on the contact bumps 22B to make low resistance electrical connections.

As also shown in FIG. 7A, the indentation 40S can be sized such that the edges 54 electrically engage the contact bumps 22B. As shown in FIG. 7B, because of size variations in the contact bumps 22B and large biasing forces, some contact bumps 22B may press into the lower cavity of the indentation 40S to form a deformed contact bump 22BD. In this case the upper cavity of the indentation 40S limits further deformation of the contact bump 22BD.

Figure 8A:
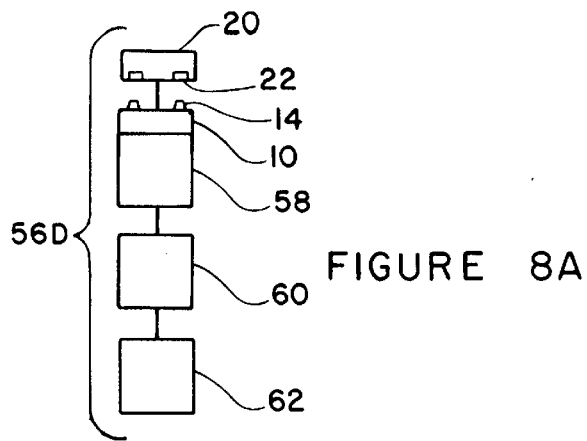
FIG. 8A is a block diagram of a die level test system constructed in accordance with the invention.
Figure 8B:
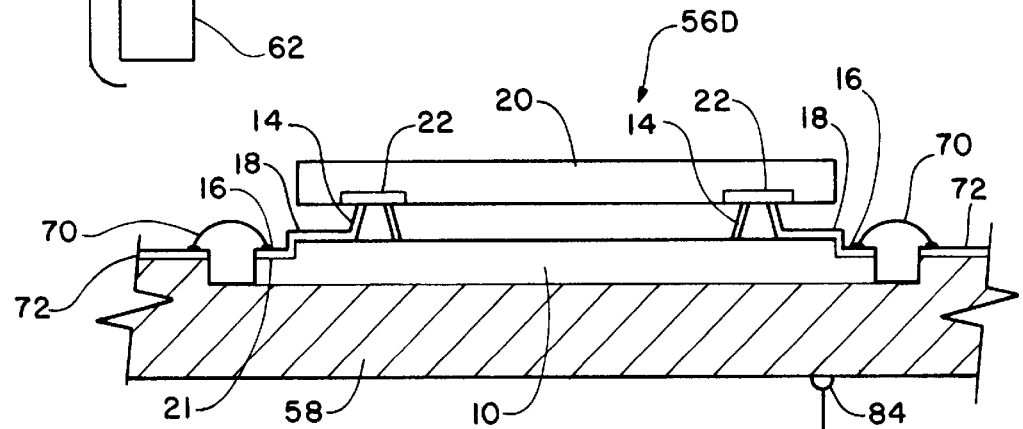
FIG. 8B is a schematic cross sectional view of the die level test system.

Die Level Test System Referring to FIGS. 8A and 8B, a die level test system 56D employing the interconnect 10 is illustrated. The die level test system 56D is configured to test components 20 in the form of singulated dice or chip scale packages. The die level test system 56D includes the interconnect 10 mounted to a test carrier 58. The test carrier 58 is configured to contain one or more components 20 for testing. In addition, the test carrier 58 is electrically connectable to a burn-in board 60 in electrical communication with test circuitry 62. The test carrier 58 can be constructed as disclosed in U.S. Pat. No. 5,519,332; U.S. Pat. No. 5,541,525; U.S. Pat. No. 5,495,179; and U.S. Pat. No. 5,302,891, each of which is incorporated by reference.

The interconnect 10 can be electrically connected to the test carrier 58 by wire bonds 70. The wire bonds 70 can be bonded to the bonding pads 18 on the interconnect 10 and to corresponding bonding pads 72 on the test carrier 58. The test carrier 58 can include external contacts 84, such as electrical pins, that are in electrical communication with the bonding pads 72 and electrically connect to the burn-in board 60 and test circuitry 62. The stepped edge 21 of the interconnect 10 provides clearance for the wire bonds 70.

The test carrier 58 can also include a biasing mechanism (not shown) for biasing the component 20 against the interconnect 10. The test circuitry 62 is adapted to transmit test signals to the integrated circuits on the component 20 and to analyze the resultant signals. Suitable test circuitry 62 is commercially available from Teradyne, Advantest, and Hewlett-Packard. The burn-in board 60 can also be in the form of a conventional burn-in board.

Wafer Level Test System

Figure 9A:
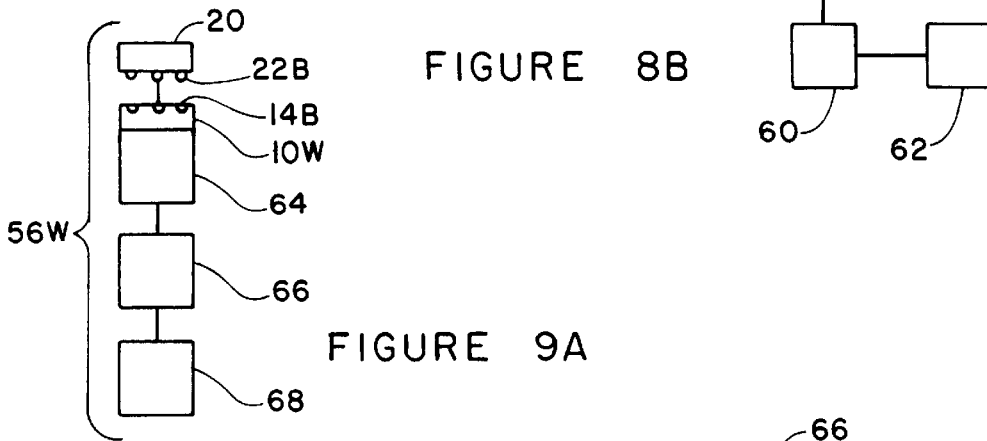
FIG. 9A is a block diagram of a wafer level test system constructed in accordance with the invention.
Figure 9B:
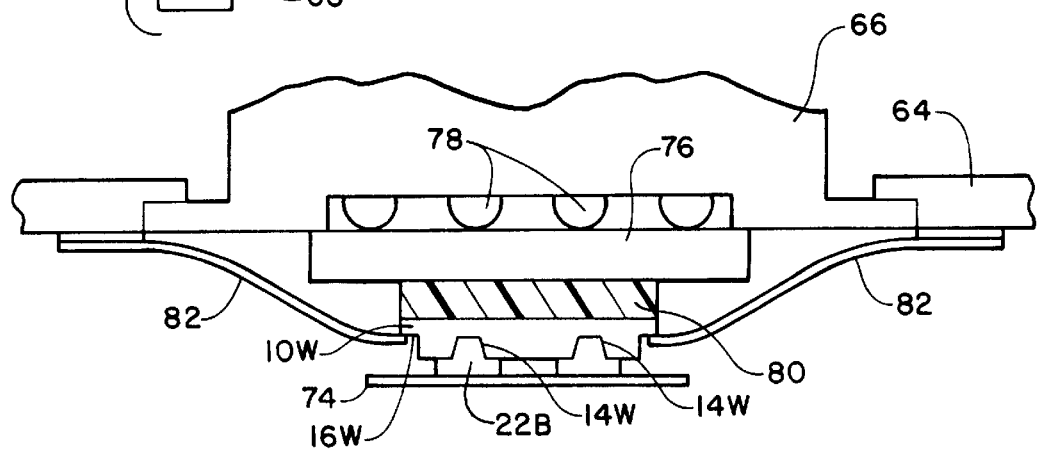
FIG. 9B is a schematic cross sectional view of the wafer level test system.

Referring to FIGS. 9A and 9B, a wafer level test system 56W employing a wafer level interconnect 10W is illustrated. The wafer level interconnect 10W can be constructed substantially as previously described for interconnect 10 but sized for testing a semiconductor wafer 74 or portion thereof. The wafer level interconnect 10W includes contact members 14W in electrical communication with bonding pads 16W. The contact members 14W can be configured to electrically connect to contact bumps 22B on the wafer 74. The wafer level interconnect 10W and contact members 14W can be configured to simultaneously test all of the dice on the wafer 74, or alternately a desired number of dice on the wafer 74.

In addition to the wafer level interconnect 10W, the wafer level test system 56W includes a testing apparatus 66 in electrical communication with testing circuitry 68. The testing apparatus 68 can be a conventional wafer probe handler, or probe tester, modified for use with the interconnect 10W. Wafer probe handlers and associated test equipment are commercially available from Electroglass, Advantest, Teradyne, Megatest, Hewlett-Packard and others. In this system 56W, the interconnect 10W takes the place of a conventional probe card and mounts to a probe card fixture 64 of the testing apparatus 66.

With interconnect 10W mounted to the test apparatus 66, the testing apparatus 66 can be used to step the wafer 74, or to step the interconnect 10W, so that the dice on the wafer 74 can be tested in groups until all of the dice on the wafer 74 have been tested. Alternately, the contact members 14W can be configured to contact every contact bump 22W for all of the dice on the wafer 74 at the same time. Test signals can then be selectively applied and electronically switched as required, to selected dice on the wafer 74.

As shown in FIG. 9B, the interconnect 10W can mount to the probe card fixture 64 of the testing apparatus 66. The probe card fixture 64 can be similar in construction to a conventional probe card fixture commercially available from manufacturers such as Packard Hughes Interconnect and Wentworth Laboratories. The probe card fixture 64 can be formed of an electrically insulating material such as FR-4 or ceramic. In addition, the testing apparatus 66 can include a force applying mechanism 78 associated with the probe card fixture 72.

The interconnect 10W can be mounted to a mounting plate 76 in contact with the force applying mechanism 78. The force applying mechanism 78 can be spring loaded pins or equivalent elements. In addition, a biasing member 80 formed of an elastomeric material, or as a fluid or gas filled bladder, can be mounted between the mounting plate 76 and interconnect 10W.

Still further, conductive paths 82 can be formed from the probe card fixture 64 to the interconnect 10W. By way of example, the conductive paths 82 can comprise multi layered tape with laminated conductors similar to TAB tape, or ASMAT manufactured by Nitto, Denko. Bonded connections can be formed to the bonding pads 16W on the interconnect 10W.

Further details of a wafer level test system similar to test system 56W are contained in U.S. patent application Ser. No. 08/797,719, filed Feb. 11, 1997, entitled "PROBE CARD FOR SEMICONDUCTOR WAFERS AND METHOD AND SYSTEM FOR TESTING WAFERS" which is incorporated herein by reference.

Thus the invention provides an improved interconnect for testing semiconductor components including dice, packages and wafers. The interconnect includes contact members with a non-oxidizing "touch" contact surface configured to provide a low resistivity electrical connection to contacts on the component with a minimal application of contact force. In addition, the contact members are configured to not excessively deform or produce large pockets or voids in the contacts. Still further, the contact members aid in centering the contacts to the interconnect and help to planarize a height of contact bumps. The interconnect also includes bonding pads having a bondable surface, and a stepped edge to provide clearance for bonded connections.

While the invention has been described with reference to certain preferred embodiments, as will be apparent to those skilled in the art, certain changes and modifications can be made without departing from the scope of the invention as defined by the following claims.

What is claimed is:

1. A method for fabricating an interconnect for testing a semiconductor component having a contact comprising:
   providing a substrate;
   forming a contact member on the substrate configured for contacting the contact on the component;
   forming a conductive layer on the contact member;
   electrolessly depositing a barrier layer on the conductive layer comprising a first material configured to prevent diffusion of the conductive layer; and
   electrolessly depositing a non-oxidizing layer on the barrier layer comprising a second material configured to provide a touch surface on the contact member for making a temporary electrical connection with the contact on the component.

2. The method of claim 1 further comprising forming a conductor and a bonding pad on the substrate in electrical communication with the conductive layer and electrolessly depositing the non-oxidizing layer on the bonding pad to provide a wire bondable surface.

3. The method of claim 1 wherein the first material comprises a material selected from the group consisting of nickel, zinc, chromium and palladium.

4. The method of claim 1 wherein the second material comprises a material selected from the group consisting of palladium, gold, tungsten, platinum, gold-platinum, silver-palladium, silver-platinum and palladium-gold.

5. A method for fabricating an interconnect for testing a semiconductor component having a contact comprising:
   providing a substrate;
   forming a contact member on the substrate comprising a pillar configured for contacting the contact on the component;
   depositing a conductive layer on the pillar and on the substrate;
   patterning and etching the conductive layer leaving the pillar at least partially covered with a portion of the conductive layer, and forming a conductor and a bonding pad in electrical communication with the portion;
   electrolessly depositing a barrier layer on the conductive layer comprising a first material configured to prevent diffusion of the conductive layer; and
   electrolessly depositing a non-oxidizing layer on the barrier layer comprising a second material configured to provide a touch surface on the contact member for making a temporary electrical connection with the contact on the component and a wire bondable surface on the bonding pad for wire bonding to the interconnect.

6. The method of claim 5 wherein the pillar comprises a projection configured to penetrate the contact on the component.

7. The method of claim 5 wherein the first material comprises a material selected from the group consisting of nickel, zinc, chromium and palladium.

8. The method of claim 5 wherein the second material comprises a material selected from the group consisting of palladium, gold, tungsten, platinum, gold-platinum, silver-palladium, silver-platinum, palladium-gold and nickel-cobalt.

9. The method of claim 5 further comprising forming a projection on the pillar configured to penetrate the contact to a limited penetration depth.

10. A method for fabricating an interconnect for testing a semiconductor component having a contact bump comprising:
   providing a substrate;
   forming a contact member on the substrate comprising an indentation configured to retain the contact bump;
   electrolessly depositing a barrier layer on the conductive layer comprising a first material configured to prevent diffusion of the conductive layer; and
   electrolessly depositing a non-oxidizing layer on the barrier layer comprising a second material configured to provide a touch surface on the contact member for making a temporary electrical connection with the contact bump on the component.

11. The method of claim 10 further comprising forming a conductor and a bonding pad on the substrate in electrical communication with the conductive layer and electrolessly depositing the non-oxidizing layer on the bonding pad to provide a wire bondable surface.

12. The method of claim 10 wherein the first material comprises a material selected from the group consisting of nickel, zinc, chromium and palladium.

13. The method of claim 10 wherein the second material comprises a material selected from the group consisting of palladium, gold, tungsten, platinum, gold-platinum, silver-palladium, silver-platinum, palladium-gold and nickel-cobalt.

14. The method of claim 10 wherein the indentation comprises a stepped surface with an edge configured to penetrate the contact bump.

15. A method for fabricating an interconnect for testing a semiconductor component having a contact comprising:

providing a substrate;

forming a contact member on the substrate configured for contacting the contact on the component and comprising a conductive layer;

electrolessly depositing a barrier layer on the conductive layer by submerging the substrate in a first solution, the barrier layer comprising a first material configured to prevent diffusion of the conductive layer; and electrolessly depositing a non-oxidizing layer on the barrier layer by submerging the substrate in a second solution, the non-oxidizing layer comprising a second material configured to provide a touch surface on the contact member for making a temporary electrical connection with the contact on the component.

16. The method of claim 15 wherein the first material comprises nickel and the second material comprises palladium.

17. The method of claim 15 further comprising forming a conductor on the substrate in electrical communication with the conductive layer.

18. The method of claim 17 further comprising electrolessly depositing the non-oxidizing layer on the conductor to provide a wire bonding surface.

19. The method of claim 15 wherein the contact member comprises a pillar comprising a portion of the substrate.

20. The method of claim 15 wherein the contact member comprises an indentation in the substrate configured to retain the contact.

21. The method of claim 15 wherein the contact member comprises a stepped indentation in the substrate comprising an edge configured to penetrate the contact.

22. The method of claim 15 wherein the first solution comprises nickel chloride, sodium hydroxyacetate, and sodium hypophosphate.

23. The method of claim 15 wherein the second solution comprises palladium chloride and sodium hypophosphate.

24. An interconnect for testing a semiconductor component having a contact comprising:

a substrate;

a contact member on the substrate configured to electrically engage a contact on the component and comprising a conductive layer;

a barrier layer on the conductive layer comprising a first material configured to prevent diffusion of the conductive layer and provide an adhesive surface; and a non-oxidizing layer on the barrier layer comprising a second material configured to provide a touch surface on the contact member for making a temporary electrical connection with the contact on the component.

25. The interconnect of claim 24 further comprising a bonding pad on the substrate in electrical communication with the conductive layer and at least partially covered by the barrier layer and the bonding layer.

26. The interconnect of claim 24 further comprising a conductor in electrical communication with the conductive layer and at least partially covered by the barrier layer and the bonding layer.

27. The interconnect of claim 24 wherein the contact member comprises a pillar on the substrate at least partially covered by the conductive layer.

28. The interconnect of claim 24 wherein the contact member comprises an indentation in the substrate at least partially covered by the conductive layer.

29. An interconnect for testing a semiconductor component having a contact comprising:

a substrate;

a contact member on the substrate configured for contacting the contact on the component;

a conductive layer on the substrate and the contact member comprising a portion at least partially covering the contact member, a conductor configured to provide an electrical path to the contact member, and a bonding pad, and a non-oxidizing layer on the conductive layer comprising a metal configured to provide a touch surface on the contact member for making a temporary electrical connection with the contact on the component, and a wire bondable surface on the bonding pad for wire bonding to the interconnect.

30. The interconnect of claim 29 further comprising a barrier layer between the conductive layer and the non-oxidizing layer comprising a material selected from the group consisting of nickel, zinc, chromium and palladium.

31. The interconnect of claim 29 wherein the metal comprises a material selected from the group consisting of palladium, gold, tungsten, platinum, gold-platinum, silver-palladium, silver-platinum, palladium-gold and nickel-cobalt.

32. The interconnect of claim 29 wherein the contact member comprises a raised pillar with at least one projection configured to penetrate the contact.

33. The interconnect of claim 29 wherein the contact member comprises an indentation configured to retain the contact.

34. The interconnect of claim 29 wherein the contact member comprises a stepped indentation with an edge configured to penetrate the contact.

35. An interconnect for testing a semiconductor component having a contact bump comprising:

a substrate;

a contact member on the substrate comprising an indentation configured to retain and electrically engage the contact bump;

a conductive layer on the substrate and the contact member covering at least a portion of the indentation and defining a conductor for providing an electrical path to the contact member, and a bonding pad for the conductor; and a non-oxidizing layer on the conductive layer comprising a metal configured to provide a touch surface on the contact member for making a temporary electrical connection with the contact bump on the component, and a wire bondable surface on the bonding pad.

36. The interconnect of claim 35 wherein the indentation comprises an inverted pyramid with an edge configured to penetrate the contact bump.

37. The interconnect of claim 35 wherein the non-oxidizing layer comprises a material selected from the group consisting of palladium, gold, tungsten, platinum, gold-platinum, silver-palladium, silver-platinum, palladium-gold and nickel-cobalt.

38. The interconnect of claim 35 wherein the substrate comprises a stepped edge wherein the bonding pad is located.

39. An interconnect for testing a semiconductor component having a contact comprising:
   a substrate;
   a contact member on the substrate comprising a pillar and a penetrating projection configured to penetrate the contact on the component to a limited penetration depth;
   a conductive layer on the substrate covering the projection and at least a portion of the pillar, and defining a conductor for the contact member and a bonding pad for the conductor;
   a barrier layer on the conductive layer comprising a first material configured to prevent diffusion of the conductive layer; and
   a non-oxidizing layer on the barrier layer comprising a second material configured to provide a touch surface on the contact member for making a temporary electrical connection with the contact on the component.

40. The interconnect of claim 39 wherein the non-oxidizing layer comprises a material selected from the group consisting of palladium, gold, tungsten, platinum, gold-platinum, silver-palladium, silver-platinum, palladium-gold and nickel-cobalt.

41. The interconnect of claim 39 wherein the substrate comprises a stepped edge wherein the bonding pad is located.

42. A system for testing a semiconductor component having a contact comprising:
   test circuitry;
   a carrier configured to contain the component comprising an external contact in electrical communication with the test circuitry; and
   an interconnect on the carrier comprising:
      a substrate
      a contact member on the substrate configured to electrically engage the contact on the component;
      a conductive layer on the substrate and the contact member comprising a conductor in electrical communication with the external contact;
      a barrier layer on the conductive layer comprising a first material configured to prevent diffusion of the conductive layer; and
      a non-oxidizing layer on the barrier layer comprising a second material configured to provide a touch surface on the contact member for making a temporary electrical connection with the contact on the component.

43. The system of claim 42 wherein the second material comprises a material selected from the group consisting of palladium, gold, tungsten, platinum, gold-platinum, silver-palladium, silver-platinum and palladium-gold.

44. The system of claim 42 wherein the component comprises an element selected from the group consisting of bare dice and chip scale packages.

45. A system for testing a semiconductor wafer having a contact comprising:
   test circuitry;
   a wafer handler in electrical communication with the test circuitry; and
   an interconnect on the wafer handler comprising:
      a substrate
      a contact member on the substrate configured to electrically engage the contact on the wafer;
      a conductive layer on the substrate and the contact member comprising a conductor in electrical communication with the test circuitry;
      a barrier layer on the conductive layer comprising a first material configured to prevent diffusion of the conductive layer; and
      a non-oxidizing layer on the barrier layer comprising a second material configured to provide a touch surface on the contact member for making a temporary electrical connection with the contact on the component.

46. The system of claim 45 wherein the second material comprises a material selected from the group consisting of palladium, gold, tungsten, platinum, gold-platinum, silver-palladium, silver-platinum, palladium-gold and nickel-cobalt.

47. The system of claim 45 further comprising a flex circuit bonded to the conductor and to a bonding site on the wafer handler.

* * * * *